(12) United States Patent
Mei et al.

(10) Patent No.: US 10,888,006 B2
(45) Date of Patent: Jan. 5, 2021

(54) OPTICAL MODULE WITH SELF-SINKING UNLOCKING AND HOUSING STRUCTURE THEREOF

(71) Applicant: WUHAN TELECOMMUNICATION DEVICES CO., LTD., Wuhan (CN)

(72) Inventors: Kai Mei, Wuhan (CN); Yi Jiang, Wuhan (CN); Benqing Quan, Wuhan (CN)

(73) Assignee: WUHAN TELECOMMUNICATION DEVICES CO., LTD., Wuhan (CN)

( * ) Notice: Subject to any disclaimer, the term of this patent is extended or adjusted under 35 U.S.C. 154(b) by 0 days.

(21) Appl. No.: 16/420,284

(22) Filed: May 23, 2019

(65) Prior Publication Data

US 2019/0289731 A1 Sep. 19, 2019

Related U.S. Application Data

(63) Continuation of application No. PCT/CN2016/110323, filed on Dec. 16, 2016.

(30) Foreign Application Priority Data

Nov. 29, 2016 (CN) .......................... 2016 1 1071060

(51) Int. Cl.
*H05K 5/02* (2006.01)
*E05C 3/02* (2006.01)
(Continued)

(52) U.S. Cl.
CPC ............. *H05K 5/0221* (2013.01); *E05C 3/02* (2013.01); *G02B 6/4201* (2013.01);
(Continued)

(58) Field of Classification Search
CPC ...... H05K 5/0221; H05K 5/03; G02B 6/4256; G02B 6/4261; G02B 6/4201; E05C 3/02; H01R 13/62938
See application file for complete search history.

(56) References Cited

U.S. PATENT DOCUMENTS 6,430,053 B1 * 8/2002 Peterson ............ H01R 13/6335
361/728
6,830,385 B2 * 12/2004 Ishigami .............. G02B 6/3897
385/53
(Continued)

FOREIGN PATENT DOCUMENTS

CN 102681110 A 9/2012
CN 203337870 U 12/2013
(Continued)

OTHER PUBLICATIONS

International Search Report dated Jul. 10, 2017; PCT/CN2016/110323.

*Primary Examiner* — Hung S. Bui
*Assistant Examiner* — Sagar Shrestha
(74) *Attorney, Agent, or Firm* — IPro, PLLC; Na Xu

(57) ABSTRACT

A housing structure of an optical module with self-sinking unlocking comprises: a base, an upper cover, a rotating lug, a support rod and a pull ring; wherein the rotating lug comprises a first connecting piece a lug, a second connecting piece and a stem, wherein the first connecting piece and the second connecting piece are respectively horizontally disposed at two ends of the stem, and the lug is disposed on the stem; and the pull ring comprises a fixing shaft, a rotating shaft and a side rod; wherein the second connecting piece of the rotating lug is disposed on the bas; the first connecting piece of the rotating lug is coupled to a right connecting
(Continued)

piece of the support rod; a left hole of the support rod is coupled to the rotating shaft of the pull ring.

11 Claims, 11 Drawing Sheets

(51) Int. Cl.
  *H05K 5/03* (2006.01)
  *G02B 6/42* (2006.01)
(52) U.S. Cl.
  CPC ......... *G02B 6/4256* (2013.01); *G02B 6/4261* (2013.01); *H05K 5/03* (2013.01)

(56) References Cited

U.S. PATENT DOCUMENTS

| | | | | |
|---|---|---|---|---|
| 7,186,134 B2* | 3/2007 | Togami | ................ | G02B 6/4246 439/160 |
| 7,699,536 B2* | 4/2010 | Yoshikawa | .......... | G02B 6/4292 385/139 |
| 7,766,686 B2* | 8/2010 | Gu | ................ | G02B 6/4201 439/372 |
| 8,083,415 B2* | 12/2011 | Moore | ................ | G02B 6/4261 385/75 |
| 10,094,991 B2* | 10/2018 | Song | ................ | G02B 6/42 |
| 10,177,494 B1* | 1/2019 | Lu | ................ | H01R 13/631 |
| 2003/0171022 A1* | 9/2003 | Distad | ................ | G02B 6/4261 439/372 |
| 2004/0062493 A1* | 4/2004 | Ishigami | ............. | G02B 6/3897 385/92 |
| 2004/0161958 A1* | 8/2004 | Togami | ............. | H01R 13/6275 439/160 |
| 2006/0215968 A1* | 9/2006 | Kayner | ................ | G02B 6/4284 385/89 |
| 2007/0059953 A1* | 3/2007 | Togami | ................ | G02B 6/4292 439/76.1 |
| 2007/0224851 A1* | 9/2007 | Togami | ................ | H04B 15/00 439/76.1 |
| 2007/0224884 A1* | 9/2007 | Engel | ................ | H01R 13/7193 439/607.01 |
| 2007/0237489 A1* | 10/2007 | Sasser | ................ | H01R 13/6594 385/147 |
| 2009/0092399 A1* | 4/2009 | Moore | ................ | G02B 6/4201 398/135 |
| 2009/0321301 A1* | 12/2009 | Song | ................ | G02B 6/4201 206/701 |
| 2010/0067199 A1* | 3/2010 | Chen | ................ | G02B 6/4261 361/747 |
| 2010/0112861 A1* | 5/2010 | Sasser | ................ | H01R 13/6275 439/607.19 |
| 2011/0267742 A1* | 11/2011 | Togami | ................ | G02B 6/4292 361/679.01 |
| 2013/0071072 A1* | 3/2013 | Xie | ................ | G02B 6/4277 385/92 |
| 2014/0219616 A1* | 8/2014 | Ishii | ................ | G02B 6/4261 385/92 |
| 2018/0275357 A1* | 9/2018 | Yizhi | ................ | G02B 6/3893 |

FOREIGN PATENT DOCUMENTS

| | | |
|---|---|---|
| CN | 103684609 A | 3/2014 |
| CN | 104516067 A | 4/2015 |
| CN | 205427250 U | 8/2016 |
| JP | 2007279509 A | 10/2007 |

* cited by examiner

OPTICAL MODULE WITH SELF-SINKING UNLOCKING AND HOUSING STRUCTURE THEREOF

CROSS-REFERENCE TO RELATED APPLICATIONS

This application is a continuation of International Application No. PCT/CN2016/110323, with an international filing date of Dec. 16, 2016, which is based upon and claims priority to Chinese Patent Application No. 201611071060.8, filed on Nov. 29, 2016, titled "OPTICAL MODULE WITH SELF-SINKING UNLOCKING AND HOUSING STRUCTURE THEREOF", the entire contents of which are incorporated herein by reference.

TECHNICAL FIELD

The present application relates to the technical field of optical modules, and in particular, relates to an optical module with self-sinking unlocking and a housing structure thereof.

BACKGROUND

With stable developments of the global telecommunications industry, the number of broadband subscribers steadily increases, which lays a solid foundation for further developments of optical communications. Till the end of 2015, the number of global fixed broadband subscribers was about 0.74 billion, which increased at a net growth of 30 million subscribers over the previous year. With a constantly increasing demand on the broadband services in the whole world, and expansion of application fields in data centers, security monitoring and the like optical communications fields, optical broadband access has become a mainstream communication mode. Under popularity of smart phones and the like terminals, and promotion of video applications, cloud computing and the like, telecommunication carriers would constantly placing investments on construction and upgrade of the mobile broadband networks and optical fiber broadband networks, and thus optical communications devices also welcome a huge investment.

With economic globalization and development of the optical communications in China, research and development capabilities and manufacture techniques of optical module manufacturers in China are drastically improved, combining product cost advantages, and thus market competitiveness are apparently enhanced, such that the communication equipment manufacturers abroad increase their purchases for the optical modules from China. In the meantime, to reduce their cost, the communication equipment manufacturers abroad are transferring their manufacture, research and development bases to China mainland in recent years, which increases the demands on optical modules in China mainland. The optical module manufacturers are also transferring some of their manufacturer bases to other developing countries. The export volume of the optical module enterprises in China has been continuously increased, and the market margin in the industry is constantly increased.

At present, enhanced optical fiber communications with growing rate and transmission capacity of the communication networks have become mainstream modern information networks. In the current optical communications network, for example, wide area networks (WAN), metropolitan area networks (MAN) and local area networks (LAN) need more and more categories of optical transceiver modules as the key optical electronic devices. In addition, higher and higher requirements and complexity are challenging. The optical modules require increasing diversities, and thus related technologies need to be developed.

Tremendous advancement of the optical communications promotes transformation and evolution of the optical modules. At present, in the severe competing optical communication market, communication devices having smaller and smaller size are desired, and interface density and more interface boards are included. To accommodate of the requirements of the optical communication equipment, optical modules are developed to small packages with high integration. Optical modules SFP+ are still mainstream products in the future 5 or 10 years. Especially, long-range, 40 km, LR SFP+ has been development rapidly, which has significant prospects and significances for improvement and optimization of the SFP+ optical modules.

At present, an unlocking mechanism of pluggable photoelectronic modules mainly includes a push and pull-type unlocking device and a pull ring-type unlocking device. The push and pull-type unlocking device is mainly applied to unlocking of a small form-factor pluggable (SFP) transceiver, and the pull ring-type unlocking device is mainly applied to unlocking of both the SFP and 10 Gb small form-factor pluggable (XFP) photoelectronic module.

A conventional pull ring-type unlocking device for an optical module includes a sliding block and a rotating pull ring, wherein the rotating pull ring is fixed by two press blocks on a bottom housing of the optical module, and the rotating pull ring has a protrusion, when the rotating pull ring rotates along an axial line by 90 degrees, the protrusion pushes the slide block to slide forward, and the slide block lifts a resilient tab on a cage of the system board, such that a hole of the resilient tab is detached from a hook on the base of the optical module, and the optical module is smoothly plugged out from the cage on the system board. In this way, the optical module is unlocked.

That is, in the conventional optical module, the slide block may be coupled to the bottom housing only by assistance of the two press blocks, and in addition, the slide block may be restored only by assistance of an additional arranged biasing member.

Chinese invention patent application No. 201210175558.4, entitled "UNLOCKING MECHANISM FOR SFP OPTICAL MODULE", has disclosed that a lock hole provided with an unlocking sliding block. The unlocking slide block is moveable in the lock hole, and the unlocking slide block is disposed above a ramp. As illustrated in FIG. 1 and FIG. 2, during unlocking, the unlocking sliding block is in contact with the ramp, and pushes via the ramp the lock head into the optical module to unlock the optical module.

Chinese invention patent application No. 201620199591.4, entitled "UNLOCKING MECHANISM FOR OPTICAL MODULE", has disclosed that a resilient restoration member is disposed in a groove at a lower end of a protrusion, and under a leverage effect of the resilient restoration member and a pull ring, locking and unlocking functions are respectively implemented. As illustrated in FIG. 3, although corresponding simplifications are made relative to the operations in the patent application No. 201210175558.4, since a resilient device is still used.

SUMMARY

An embodiment of the present disclosure provides a housing structure of an optical module with self-sinking unlocking. The housing structure includes: a base, an upper cover, a rotating lug, a support rod and a pull ring; wherein the rotating lug includes a first connecting piece a lug, a second connecting piece and a stem, wherein the first connecting piece and the second connecting piece are respectively horizontally disposed at two ends of the stem, and the lug is disposed on the stem; and the pull ring includes a fixing shaft, a rotating shaft and a side rod, wherein the rotating shaft is disposed in the middle of the fixing shaft and protrudes from the fixing shaft, and is configured to generate a torque via the rotating shaft when the pull ring rotates about the fixing shaft; wherein the second connecting piece of the rotating lug is disposed on the base; the first connecting piece of the rotating lug is coupled to a right connecting piece of the support rod; a left hole of the support rod is coupled to the rotating shaft of the pull ring; and when the pull ring is closed for an unlock operation, the rotating shaft is configured to drive the support rod generates a traction force for the first connecting piece of the rotating lug, such that the rotating lug rotates towards the upper cover in a fashion of surrounding the fixed second connecting piece under the traction force; and wherein the upper cover is provided with a groove structure for passing through the rotating lug.

Another embodiment of the present disclosure provides an optical module structure with self-sinking unlocking. The optical module structure includes: a base, a PCB, an upper cover, a rotating lug, a cover plate, an ROSA, a support rod, a pull ring, a TOSA and a fully coated resilient tab, the PCB, the ROSA and the TOSA being disposed on the base and fixed via the upper cover, the fully-coated resilient tab being fixed to an outer ring of the base and the upper cover; wherein the rotating lug includes a first connecting piece a lug, a second connecting piece and a stem, wherein the first connecting piece and the second connecting piece are respectively horizontally disposed at two ends of the stem, and the lug is disposed on the stem; and the pull ring includes a fixing shaft, a rotating shaft and a side rod, wherein the rotating shaft is disposed in the middle of the fixing shaft and protrudes from the fixing shaft, and is configured to generate a torque via the rotating shaft when the pull ring rotates about the fixing shaft; wherein the second connecting piece of the rotating lug is disposed on the base; the first connecting piece of the rotating lug is coupled to a right connecting piece of the support rod; a left hole of the support rod is coupled to the rotating shaft of the pull ring; and when the pull ring is closed for an unlock operation, the rotating shaft is configured to drive the support rod generates a traction force for the first connecting piece of the rotating lug, such that the rotating lug rotates towards the upper cover in a fashion of surrounding the fixed second connecting piece under the traction force; and wherein the upper cover is provided with a groove structure for passing through the rotating lug.

BRIEF DESCRIPTION OF THE DRAWINGS

For clearer description of the technical solutions according to the embodiments of the present application, hereinafter brief description is given with reference to the accompanying drawings for illustrating the embodiments. Apparently, the accompanying drawings described hereinafter only illustrate some embodiments of the present application, and other accompanying drawings may also be derived based on these accompanying drawings.

DETAILED DESCRIPTION

Figure 1:
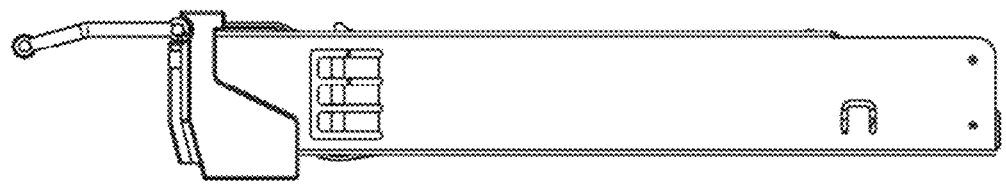
FIG. 1 is a schematic structural diagram of an unlocking mechanism of an SFP optical module according to the related art.
Figure 2:
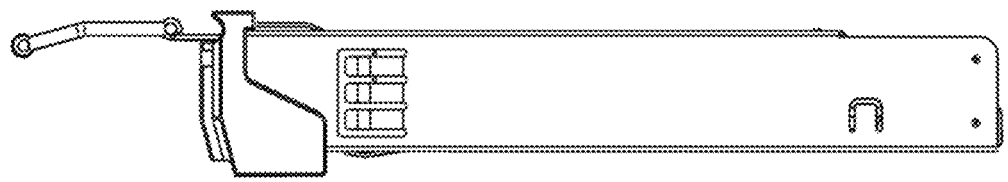
FIG. 2 is a schematic structural diagram of an unlocking mechanism of an SFP optical module according to the related art.
Figure 3:
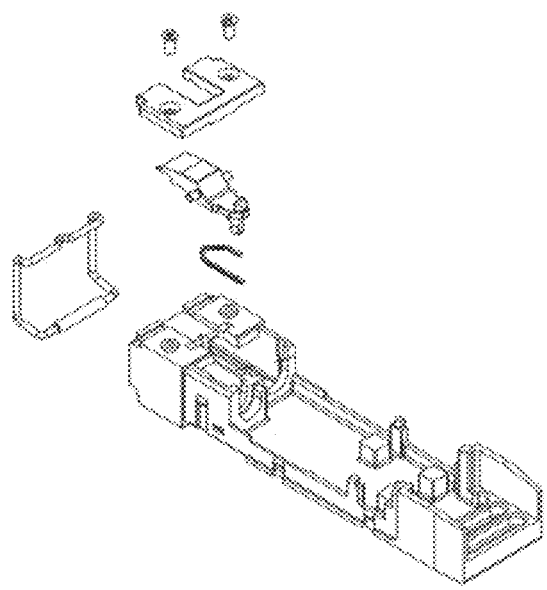
FIG. 3 is a schematic structural diagram of another unlocking mechanism of an optical module according to the related art.

For clear description of objectives, technical solutions, and advantages of the present application, the present application is further described in detail below by reference to the embodiments and the accompanying drawings. It should be understood that the embodiments described here are only exemplary ones for illustrating the present application, and are not intended to limit the present application.

In the description of the present application, it should be understood that the terms "inner", "outer", "internal", "external", "transversal", "longitudinal", "upper", "lower", "top", "bottom" and the like indicate orientations and position relationships which are based on the illustrations in the accompanying drawings, and these terms are merely for ease and brevity of the description, instead of indicating or implying that the devices or elements shall have particular orientations and shall be structured and operated based on the particular orientations. Accordingly, these terms shall not be construed as limiting the present application.

In addition, technical features involved in various embodiments of the present application described hereinafter may be combined as long as these technical features are not in conflict.

Embodiment 1

The embodiment of the present application provides a housing structure of an optical module with self-sinking unlocking. As illustrated in FIG. 4 to FIG. 7, the housing structure includes: a base 1, an upper cover 3, a rotating lug 5, a support rod 8 and a pull ring 9. The rotating lug 5 includes a first connecting piece 5-1 a lug 5-2, a second connecting piece 5-3 and a stem 5-4, wherein the first connecting piece 5-1 and the second connecting piece 5-3 are respectively disposed at two ends of the stem 5-4, and the lug 5-2 is disposed on the stem 5-4. The pull ring 9 includes a fixing shaft 9-1, a rotating shaft 9-2 and a side rod 9-4, wherein the rotating shaft 9-2 is disposed in the middle of the fixing shaft 9-1 and protrudes from the fixing shaft 9-1. The rotating shaft 9-2 is configured to generate a torque driving the support rod 8 via the rotating shaft 9-2 when the pull ring 9 rotates about the fixing shaft 9-1.

The second connecting piece 5-3 of the rotating lug 5 is disposed on the base 1; the first connecting piece 5-1 of the rotating lug 5 is coupled to a right connecting piece of the support rod 8; a left hole 8-1 of the support rod 8 is coupled to the rotating shaft 9-2 of the pull ring 9. When the pull ring 9 is closed for an unlock operation, the rotating shaft 9-2 is configured to drive the support rod 8 generates a traction force for the first connecting piece 5-1 of the rotating lug 5, such that the rotating lug 5 rotates towards the upper cover 3 in a fashion of surrounding the fixed second connecting piece 5-3 under the traction force.

Figure 18:
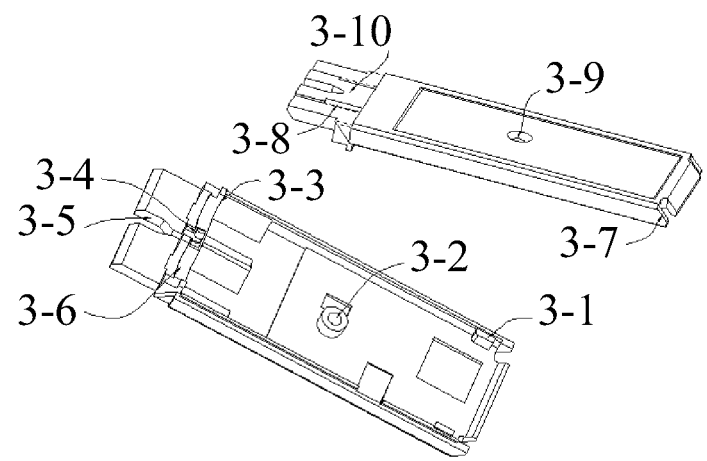
FIG. 18 is a schematic structural diagram of an upper cover of an optical module with self-sinking unlocking according to an embodiment of the present application.

The upper cover 3 is provided with a groove structure for passing through the rotating lug 5. As illustrated in FIG. 18, the groove structure is a V-shaped groove 3-5.

According to the embodiments of the present application, a self-sinking unlocking assembly is practiced in the optical module, wherein the unlocking assembly is provided without a spring, and thus installation is simple. The support rod may employ a powder metallurgy structure, and thus the strength and rigidity thereof satisfy a stability requirement. The pull ring restores, and the rotating lug is rese. During unlocking, the rotating lug sinks, and the operations are simple and convenient. Therefore, the resilient tag of a cage (a frame for fixing the optical module) may not be extruded, and repeated plugging of the optical module may not cause fatigue damages or permanent deformations for the cage.

Figure 5A:
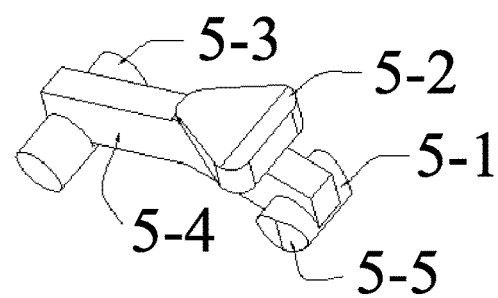
FIG. 5A is a schematic structural diagram of a rotating lug of an optical module with self-sinking unlocking according to an embodiment of the present application.
Figure 5B:
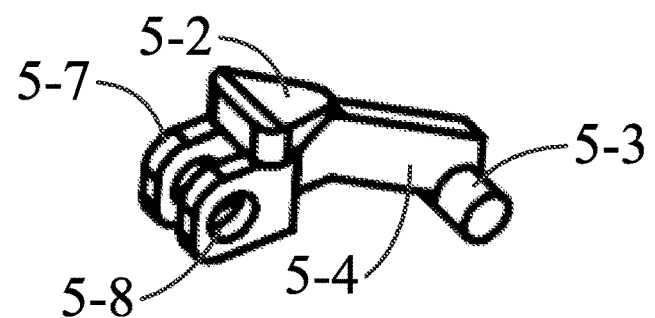
FIG. 5B is a schematic structural diagram of a rotating lug of an optical module with self-sinking unlocking according to another embodiment of the present application.
Figure 6:
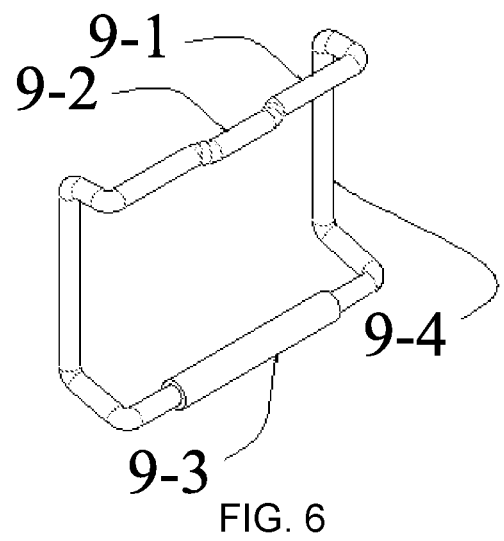
FIG. 6 is a schematic structural diagram of a pull ring of an optical module with self-sinking unlocking according to an embodiment of the present application.
Figure 7A:
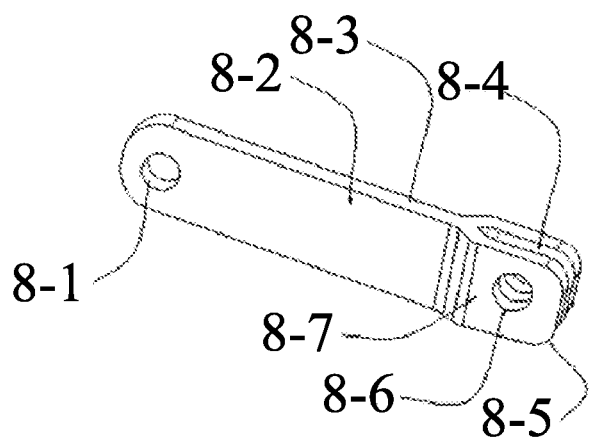
FIG. 7A is a schematic structural diagram of a support rod of an optical module with self-sinking unlocking according to an embodiment of the present application.
Figure 7B:
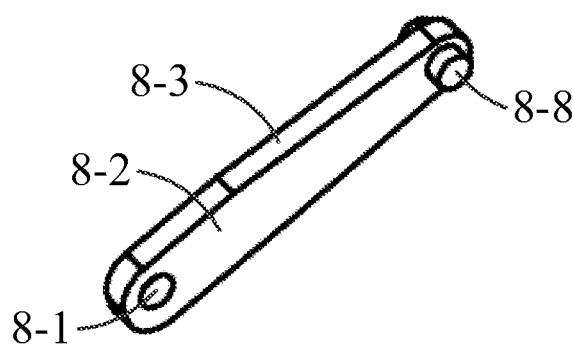
FIG. 7B is a schematic structural diagram of a support rod of an optical module with self-sinking unlocking according to another embodiment of the present application.

In an implementation manner of the embodiment of the present application, the support rod 8 and the rotating lug 5 may be coupled in a plurality of fashions. For example, as illustrated in FIG. 5A and FIG. 7A, the right connecting piece of the support rod 8 is a hole pair 8-6 defined on two parallel arms 8-4. The first connecting piece 5-1 is a first rotating shaft 5-1 and two ends of the first rotating shaft 5-1 respectively pass through the hole pair 8-6, wherein the stem 5-4 fixing the first rotating shaft 5-1 is partially disposed between the two arms 8-4. In addition, specific implementation structures of the first connecting piece 5-1 of the rotating lug 5 and the right connecting piece of the support rod 8 in the above coupling fashion may be exchanged, that is, as illustrated in FIG. 5B and FIG. 7B, the first connecting piece 5-1 of the rotating lug 5 is designed to a hole pair 5-8 defined on two parallel arms 5-7, and the right connecting piece of the support rod 8 is designed to a form of the first rotating shaft 8-8, thereby practicing the coupling. In combination with the above coupling fashion, an extensible implementation manner may be present, which may provide convenience to the mounting course in the above coupling fashion and the extended solution thereof. The structure in the above coupling fashion is specifically used as an example. As illustrated in FIG. 5, an end face of the first rotating shaft 5-1 is machined to a structure with a ramp (as illustrated in FIG. 5-5), and when the rotating lug 5 is coupled to the support rod 8, the first rotating shaft 5-1 is configured to pushed from an apex angle of the ramp into the hole pair 8-6 formed by the two arms 8-4 of the support rod 8.

Figure 8:
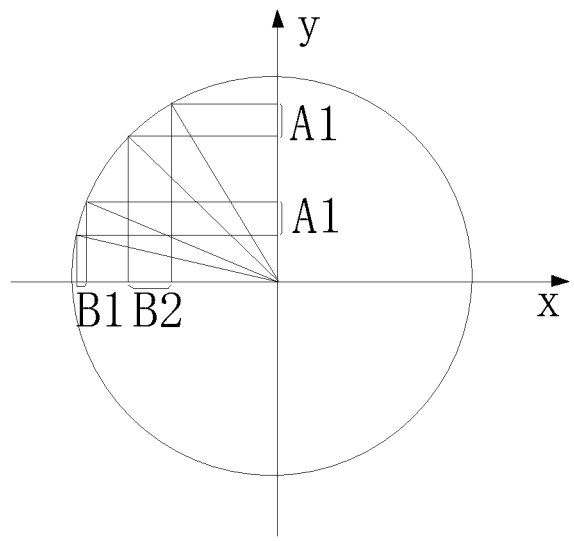
FIG. 8 is a schematic diagram illustrating a rotation aspect ratio of a lug according to an embodiment of the present application.
Figure 9:
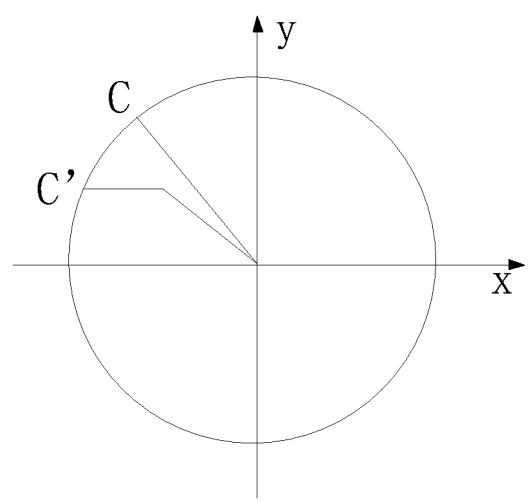
FIG. 9 is a schematic diagram illustrating a rotation aspect ratio of an adjusted lug according to an embodiment of the present application.

During the design, the stem 5-4 of the rotating lug 5 is generally configured to be bent by a specified angle at the position where the lug 5-2 is located, wherein the specified angle for bending is determined based on the fact that, during locking and unlocking, a tangent of a movement trajectory of the lug 5-2 on the groove structure of the upper cover 3 is perpendicular to a surface of the upper cover 3. The effect is that the movement of the lug 5-2 on a contact surface of the cage is as far as possible within a perpendicular range. This design not only reduces friction that may be caused by the lug 5-2 and the contact surface of the cage, but also improves stability of the lug 5-2 and the cage upon locking. In the above design, in an unlocking state, relative to a bottom plate of the base 1, where the rotating shaft 9-2 is disposed above the second connecting piece 5-3 of the rotating lug 5, a better effect is achieved. As illustrated in FIG. 8, as the stem 5-4 approaches the y axis, a horizontal displacement distance for movement by a unit height is greater, and for movement to an A1 height in FIG. 8, with respect to different base points, two horizontal displacement distances B1 and B2 in FIG. 8 are respectively needed. The bending by a specified angle is equivalent to lower point C (when the stem 5-4 is in an upright state) to a position C'. As illustrated in FIG. 9, the horizontal displacement distance may be effectively reduced.

In the embodiment of the present application, it needs to be ensured that, during locking and unlocking, the lug 5-2 may move in a defined range without going beyond the range, that is, during locking and unlocking, an included angle defined by the support rod 8 and the rotating lug 5 via a connecting point is an obtuse angle on a side facing towards the upper cover 3. The following solutions may be employed with reference to the embodiments of the present application.

Solution 1

A cover plate 6 is disposed on the base 1 and above the support rod 8, wherein a bending face 6-1 of the cover plate 6 is disposed above the support rod 8. The bending face 6-1 is configured to abut against a stem 8-2 of the support rod 8, such that in a locking state, prevent the included angle defined by the support rod 8 and the rotating lug 5 via the connecting point is not an obtuse angle on a side facing towards the base 1.

Solution 2

Figure 10:
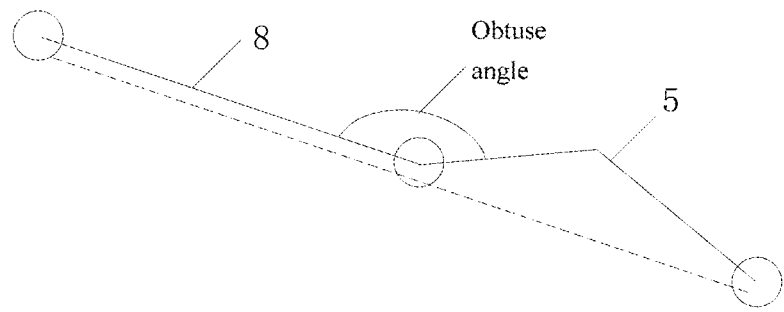
FIG. 10 is a schematic diagram of a working state of a connecting piece coupling the support rod and the rotating lug according to an embodiment of the present application.
Figure 11:
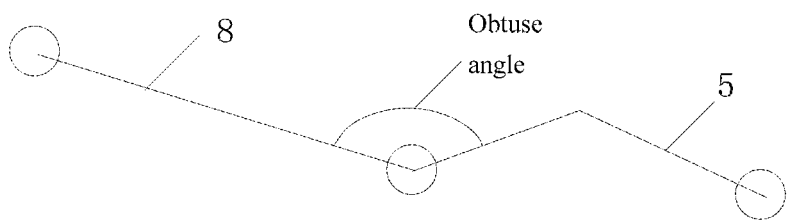
FIG. 11 is a schematic diagram of a working state of a connecting piece coupling the support rod and the rotating lug according to an embodiment of the present application.

An appropriate bending angle is defined on the stem 5-4 of the rotating lug 5, such that in the locking state, when the left hole 8-1 and the right connecting piece of the support rod 8, and the second connecting piece 5-3 of the rotating lug 5 are disposed on a line (or these three points are approximately on a line, and corresponding customization is practiced based on the actual needs; wherein such configuration is only one way of practicing the locking state), prevent the included angle defined by the support rod 8 and the rotating lug 5 via the connecting point is an obtuse angle on the side facing towards the base 1. FIG. 10 is a schematic diagram of the support rod 8 and the rotating lug 5 in a locking state is illustrated. FIG. 11 is a schematic diagram of the support rod 8 and the rotating lug 5 in an unlocking state.

Figure 12:
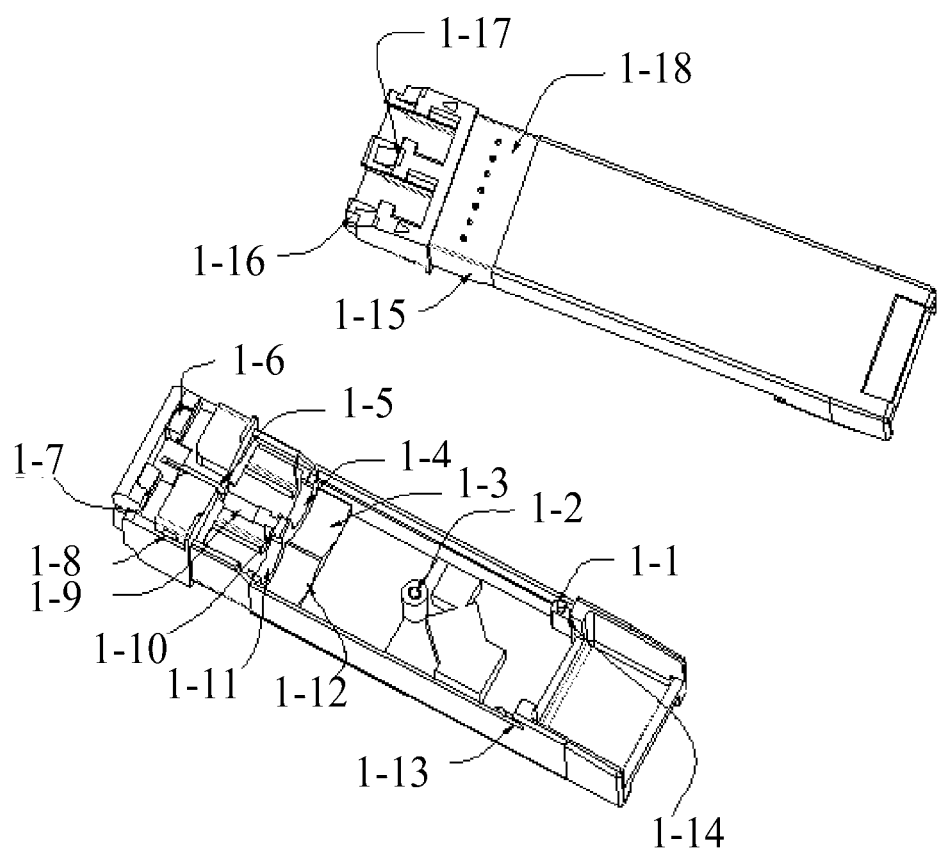
FIG. 12 is a schematic structural diagram of a base of an optical module with self-sinking unlocking according to an embodiment of the present application.

In the embodiment of the present application, although the support rod 8 may employ a powder metallurgy structure and the strength and rigidity satisfy the stability requirement. However, the pull ring 9 and the rotating lug 5 that are coupled to the support rod 8 may cause abrasive wear on various device interfaces because the stress during transmission is not on a straight line. Therefore, with respect to the embodiment of the present application, an extensible implementation solution may be provided for improving the above problem. As illustrated in FIG. 12, the base 1 is provided with a groove 1-5, wherein the groove 1-5 is configured to receive the stem 8-2 of the support rod 8. In this way, during movement of the support rod 8, a left-right offset may not exceeds a range defined by the groove 1-5.

Figure 4:
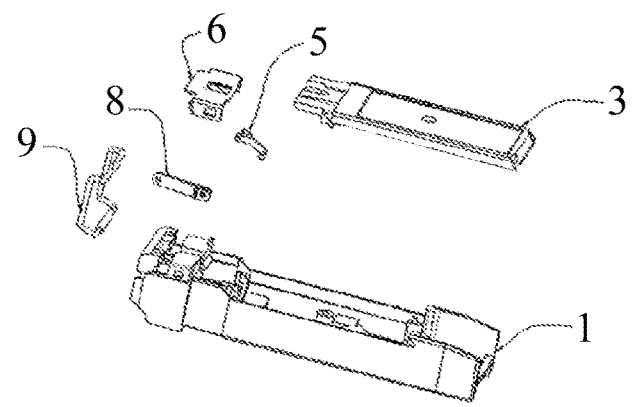
FIG. 4 is an exploded diagram of a housing structure of an optical module with self-sinking unlocking according to an embodiment of the present application.

With reference to the embodiment of the present application, with respect to the feature that the second connecting piece 5-3 is disposed on the base 1 in the embodiment, when the second connecting piece 5-3 is a second rotating shaft 5.3, a corresponding connecting structure may be practiced as follows:

The second rotating shaft 5-3 is engaged with a semicircular groove 1-10 on the base 1 and a semicircular groove 3-4 on the upper cover 3. As illustrated in FIG. 4 and FIG. 12, the corresponding semicircular groove 1-10 is provided.

Alternatively, another fashion may be employed. Specifically, an end face of the second rotating shaft 5-3 is machined to a structure with a ramp, and when the second rotating shaft 5-3 is coupled to the semicircular groove 1-10, the second rotating shaft 5-3 is configured to pushed from an apex angle side into a hole pair in the semicircular groove 1-10 on the base 1. This fashion is similar to the first connecting fashion between the support rod 8 and the rotating lug 5.

Embodiment 2

Figure 13:
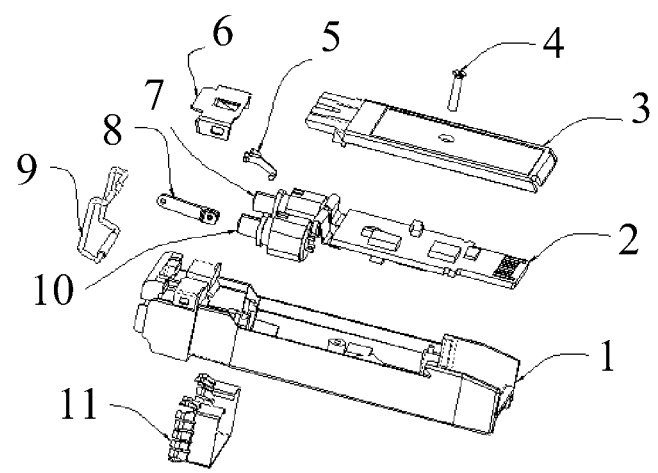
FIG. 13 is an exploded diagram of an optical module with self-sinking unlocking according to an embodiment of the present application.
Figure 14:
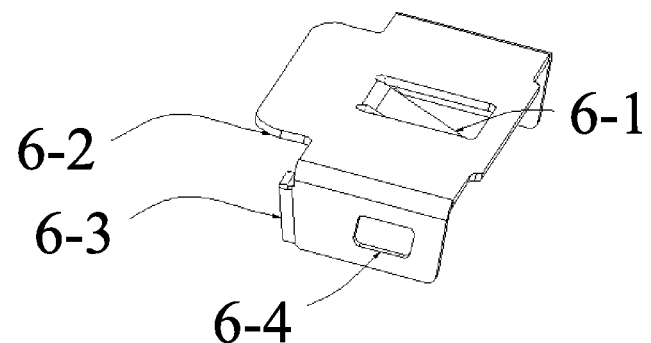
FIG. 14 is a schematic structural diagram of a cover plate of an optical module with self-sinking unlocking according to an embodiment of the present application.
Figure 15:
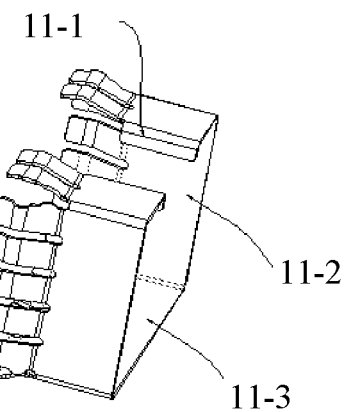
FIG. 15 is a schematic structural diagram of a fully-coated resilient tab of an optical module with self-sinking unlocking according to an embodiment of the present application.

The embodiment of the present application provides an optical module structure with self-sinking unlocking. As illustrated in FIG. 13 to FIG. 15 (referring to FIG. 5 to FIG. 7), the optical module structure includes: a base 1, a PCB 2, an upper cover 3, a rotating lug 5, a cover plate 6, an ROSA 7, a support rod 8, a pull ring 9, a TOSA 10 and a fully coated resilient tab 11. The PCB 2, the ROSA 7 and the TOSA 10 are disposed on the base 1 and fixed via the upper cover 3. The fully-coated resilient tab 11 is fixed to an outer ring of the base 1 and the upper cover 3. The rotating lug 5 includes a first connecting piece 5-1, a lug 5-2, a second connecting piece 5-3 and a stem 5-4, wherein the first connecting piece 5-1 and the second connecting piece 5-3 are respectively horizontally disposed at two ends of the stem 5-4, the lug 5-2 is disposed on the stem 5-4. The pull ring 9 includes a fixing shaft 9-1, a rotating shaft 9-2 and a side rod 9-4, wherein the rotating shaft 9-2 is disposed in the middle of the fixing shaft 9-1 and protrudes from the fixing shaft 9-1. The rotating shaft 9-2 is configured to generate a torque via the rotating shaft 9-2 when the pull ring 9 rotates about the fixing shaft 9-1.

The second connecting piece 5-3 of the rotating lug 5 is disposed on the base 1, wherein the second connecting piece 5-3 is fixed to a position on a left side stage of the ROSA 7 and the TOSA 10. The first connecting piece 5-1 of the rotating lug 5 is coupled to a right connecting piece of the support rod 8. A left hole 8-1 of the support rod 8 is coupled to the rotating shaft 9-2 of the pull ring 9. When the pull ring 9 is closed for an unlock operation, the rotating shaft 9-2 is configured to drive the support rod 8 generates a traction force for the first connecting piece 5-1 of the rotating lug 5, such that the rotating lug 5 rotates towards the upper cover 3 in a fashion of surrounding the fixed second connecting piece 5-3 under the traction force.

The upper cover 3 is provided with a groove structure for passing through the rotating lug 5, and the cover plate 6 is disposed on the base 1.

The present application provides an SFP+ optical module stricture with self-sinking unlocking, which is applicable to package of coaxial devices of the optical module, for example, a transmitter optical subassembly (TOSA), a receiver optical subassembly (ROSA) and a bi-direction optical subassembly (BOSA). The module structure mainly includes (a) a PCB-located package structure, (b) a device-located package structure, and (c) a self-sinking unlocking mechanism. The self-sinking unlocking mechanism employs the principle of a crank-connecting rod mechanism, which rotates the pull ring, tractions the support rod to move, and drives the rotating lug to rotate. In this way, the triangular lug sink, and unlocking is implemented. The upper cover and the base restrict a rotation range of the rotating lug. The pull ring is controlled to rotate within a range of 0 to 90 degrees, which complies with the protocol requirements of the current mainstream SFP+ optical module.

Related practice details and extensible solutions of the self-sinking unlocking mechanism may be referenced to the related disclosure in the first embodiment, which are thus not described herein any further. Subsequently, with respect to a specific SFP+ optical module, the PCB-located package structure and the device-located package structure thereof are illustrated hereinafter.

Figure 19:
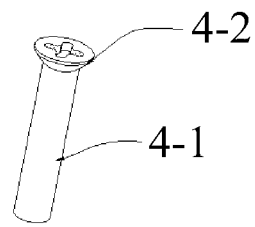
FIG. 19 is a schematic structural diagram of a screw of an optical module with self-sinking unlocking according to an embodiment of the present application.
Figure 20:
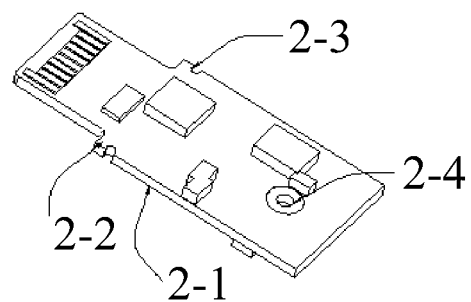
FIG. 20 is a schematic structural diagram of a PCB of an optical module with self-sinking unlocking according to an embodiment of the present application.

As illustrated in FIG. 18 to FIG. 20, a bottom face 2-1 of the PCB 2 is attached to a boss 1-14 of the base 1, and a semicircular hole 2-3 of the PCB 2 is cooperatively assembled with a semicircular post 1-1 of the base 1. A stud 4-1 of the screw 4 passes through a through hole 3-2 of the upper cover 3 and a via 2-4 of the PCB 2, and is screwed into a threaded hole 1-2 of the base 1. A nut tapered face 4-2 of the screw 4 is attached to a counter hole 3-9 of the upper cover 3. A press block 3-1 of the upper cover 3 presses against a lamination face 2-2 of the PCB 2.

Figure 21:
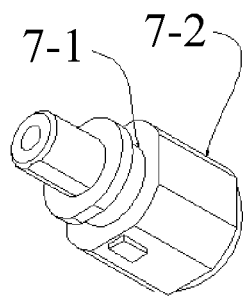
FIG. 21 is a schematic structural diagram of an ROSA of an optical module with self-sinking unlocking according to an embodiment of the present application.

As illustrated in FIG. 21, a latching cylindrical face 7-1 of the ROSA 7 is attached to a right semi-cylindrical face 1-4 of the base 1, and a tail end 7-2 of the ROSA 7 is disposed in a right depressed face 1-3 of the base 1.

Figure 22:
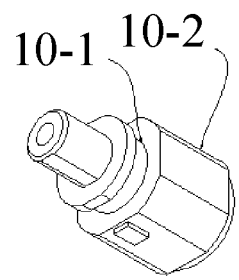
FIG. 22 is a schematic structural diagram of a TOSA of an optical module with self-sinking unlocking according to an embodiment of the present application.

As illustrated in FIG. 22, a latching cylindrical face 10-1 of the TOSA 10 is attached to a left semi-cylindrical face 1-11 of the base 1, and a tail end 10-2 of the TOSA 10 is disposed in a left depressed face 1-12 of the base 1.

In the embodiment of the present application, a fixing shaft 9-1 of the pull ring 9 is cooperated with a U-shaped groove 1-7 of the base 1, a side rod 9-4 of the pull ring 9 is attached to a tail end side face 1-16 of the base 1, and a rubber coating 9-3 of the pull ring 9 is attached to a semicircular bump 1-17 of the base 1.

Figure 23:
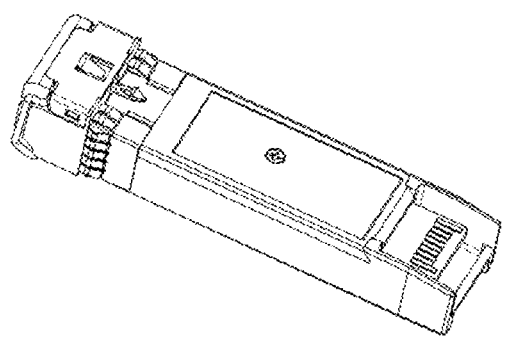
FIG. 23 is a schematic appearance structural diagram of an optical module with self-sinking unlocking according to an embodiment of the present application.

As illustrated in FIG. 23 and FIG. 12, a bending tab 11-1 of the fully-coated resilient tab 11 is inserted into a square groove 3-8 of the upper cover 3, an inner side face 11-2 of the fully-coated resilient tab 11 is cooperated with a side planar face 1-15 of the base 1, and an inner bottom face 11-3 of the fully-coated resilient tab 11 is cooperated with a bottom planar face 1-18 of the base 1.

As illustrated in FIG. 18, a wedge block 3-7 of the upper cover 3 is cooperated with a triangular groove 1-13 of the base 1, and a V-shaped groove 3-5 of the upper cover 3 is cooperated with a triangular bump 5-2 of the rotating lug 5. A right circular groove 3-3 of the upper cover 3 is cooperate with the latching cylindrical face 10-1 of the TOSA 10, and a left circular groove 3-6 of the upper cover 3 is cooperated with the latching cylindrical face 7-1 of the ROSA 7.

As illustrated in FIG. 14, an inner planar face 6-2 of the cover plate 6 is cooperated with a groove bottom face 1-6 of the base 1, a side square hole 6-4 of the cover plate 6 is cooperated with a side oblique boss 1-8 of the base 1, and a rear ramp 6-3 of the cover plate 6 is tangentially cooperated with a fixing shaft 9-1 of the pull ring 9.

Figure 16:
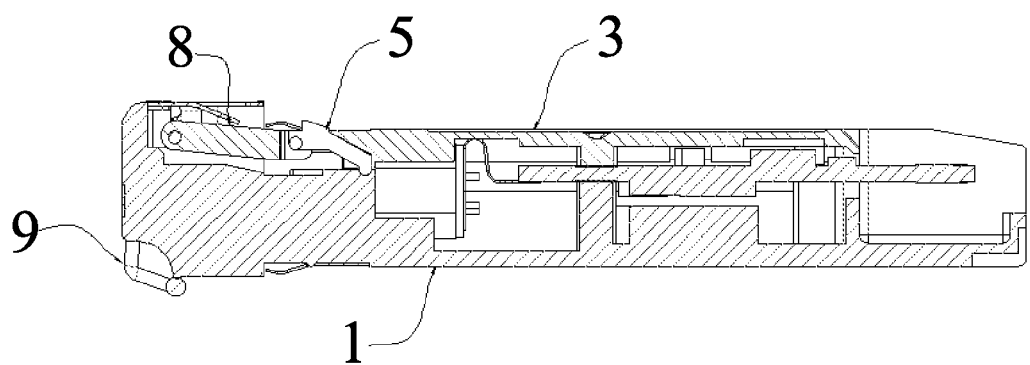
FIG. 16 is a schematic structural diagram of an optical module with self-sinking unlocking in a locking state according to an embodiment of the present application.

In the embodiment of the present application, the optical module is locked as follows (as illustrated in FIG. 16): The pull ring 9 is disposed as illustrated in FIG. 14, the triangular bump 5-2 of the rotating bump 5 is disposed on an upper apex face 3-10 of the upper cover 3, the triangular bump 5-2 of the rotating lug 5 is latched in the corresponding hole of the cage, such that the module is locked.

Figure 17:
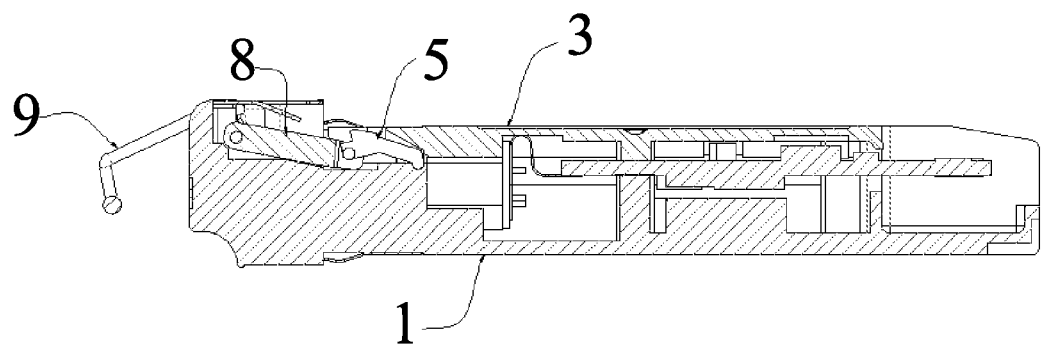
FIG. 17 is a schematic structural diagram of an optical module with self-sinking unlocking in an unlocking state according to an embodiment of the present application.

In the embodiment of the present application, the optical module is unlocked as follows (as illustrated in FIG. 17): The pull ring 9 is configured to rotated to drive the support rod 8, the support rod 8 drives the rotating lug 5 to rotate to a position as illustrated in FIG. 15, a circular angular face 8-5 of the support rod 8 is in contact with a stop face 1-9 of the base 1, the rotation is stopped, the triangular bump 5-2 of the rotating lug 5 is disposed below the upper apex face 3-10 of the upper cover 3, the triangular bump 5-2 of the rotating lug 5 is released from the corresponding hole of the cage, such that the module is unlocked.

The above described embodiments are merely preferred embodiments of the present application, but are not intended to limit the present application. Any modification, equivalent replacement, and improvement made without departing from the spirit and principle of the present application shall fall within the protection scope of the present application.

What is claimed is:

1. A housing structure of an optical module with self-sinking unlocking, comprising: a base (1), an upper cover (3), a rotating lug (5), a support rod (8) and a pull ring (9); wherein
 the rotating lug (5) comprises a first connecting piece (5-1), a lug (5-2), a second connecting piece (5-3) and a stem (5-4), wherein the first connecting piece (5-1) and the second connecting piece (5-3) are respectively horizontally disposed at two ends of the stem (5-4), and the lug (5-2) is disposed on the stem (5-4); and the pull ring (9) comprises a fixing shaft (9-1), a rotating shaft (9-2) and a side rod (9-4), wherein the rotating shaft (9-2) is disposed in the middle of the fixing shaft (9-1) and protrudes from the fixing shaft (9-1), and is configured to generate a torque via the rotating shaft (9-2) when the pull ring (9) rotates about the fixing shaft (9-1); wherein
 the second connecting piece (5-3) of the rotating lug (5) is disposed on the base (1); the first connecting piece (5-1) of the rotating lug (5) is coupled to a right connecting piece of the support rod (8); a left hole (8-1) of the support rod (8) is coupled to the rotating shaft (9-2) of the pull ring (9); and when the pull ring (9) is closed for an unlock operation, the rotating shaft (9-2) is configured to drive the support rod (8) generates a traction force for the first connecting piece (5-1) of the rotating lug (5), such that the rotating lug (5) rotates towards the upper cover (3) in a fashion of surrounding the fixed second connecting piece (5-3) under the traction force; and wherein
 the upper cover (3) is provided with a groove structure (3-5) for passing through the rotating lug (5), wherein
 the right connecting piece of the support rod (8) is a hole pair (8-6) defined on two parallel arms (8-4), wherein the first connecting piece (5-1) is a first rotating shaft (5-1) and two ends of the first rotating shaft (5-1) respectively pass through the hole pair (8-6), and wherein the stem (5-4) fixing the first rotating shaft (5-1) is partially disposed between the two arms (8-4).

2. The housing structure of an optical module with self-sinking unlocking according to claim 1, wherein an end face of the first rotating shaft (5-1) is a structure with a ramp, and when the rotating lug (5) is coupled to the support rod (8), the first rotating shaft (5-1) is configured to pushed from an apex angle side of the ramp into the hole pair (8-6) in the two arms (8-4) of the support rod (8).

3. The housing structure of an optical module with self-sinking unlocking according to claim 1, wherein the base (1) is provided with a groove (1-5), wherein the groove (1-5) is configured to receive a stem (8-2) of the support rod (8).

4. The housing structure of an optical module with self-sinking unlocking according to claim 1, wherein when the second connecting piece (5-3) is a second rotating shaft (5-3), the second connecting piece (5-3) is disposed on the base (1); wherein
 the second rotating shaft (5-3) is engaged with a semicircular groove (1-10) on the base (1) and a semicircular groove (3-4) on the upper cover (3); or
 an end face of the second rotating shaft (5-3) is a structure with a ramp, and when the second rotating shaft (5-3) is coupled to the semicircular groove (1-10), the second rotating shaft (5-3) is configured to pushed from an apex angle side into a hole pair in the semicircular groove (1-10) on the base (1).

5. The housing structure of an optical module with self-sinking unlocking according to claim 1, wherein in an unlocking state, relative to a bottom plate of the base (1 the rotating shaft (9-2) is disposed above the second connecting piece (5-3) of the rotating lug (5); and wherein the stem (5-4) of the rotating lug (5) is configured to be bent at a position where the lug (5-2) is fixed, such that during locking and unlocking, a tangent of a movement trajectory of the lug (5-2) on the groove structure (3-5) of the upper cover (3) is configured to be perpendicular to a surface of the upper cover (3).

6. An optical module structure with self-sinking unlocking, comprising: a base (1), a PCB (2), an upper cover (3), a rotating lug (5), a cover plate (6), a Receiver Optical Subassembly (7), a support rod (8), a pull ring (9), a Transmitter Optical Subassembly (10) and a fully coated resilient tab (11), the PCB (2), the Receiver Optical Subassembly (7) and the Transmitter Optical Subassembly (10) being disposed on the base (1) and fixed via the upper cover (3), the fully-coated resilient tab (11) being fixed to an outer ring of the base (1) and the upper cover (3); wherein the rotating lug (5) comprises a first connecting piece (5-1) a lug (5-2), a second connecting piece (5-3) and a stem (5-4), wherein the first connecting piece (5-1) and the second connecting piece (5-3) are respectively horizontally disposed at two ends of the stem (5-4), and the lug (5-2) is disposed on the stem (5-4); and the pull ring (9) comprises a fixing shaft (9-1), a rotating shaft (9-2) and a side rod (9-4), wherein the rotating shaft (9-2) is disposed in the middle of the fixing shaft (9-1) and protrudes from the fixing shaft (9-1), and is configured to generate a torque via the rotating shaft (9-2) when the pull ring (9) rotates about the fixing shaft (9-1); wherein the second connecting piece (5-3) of the rotating lug (5) is disposed on the base (1); the first connecting piece (5-1) of the rotating lug (5) is coupled to a right connecting piece of the support rod (8); a left hole (8-1) of the support rod (8) is coupled to the rotating shaft (9-2) of the pull ring (9); and when the pull ring (9) is closed for an unlock operation, the rotating shaft (9-2) is configured to drive the support rod (8) generates a traction force for the first connecting piece (5-1) of the rotating lug (5), such that the rotating lug (5) rotates towards the upper cover (3) in a fashion of surrounding the fixed second connecting piece (5-3) under the traction force; and wherein the upper cover (3) is provided with a groove structure (3-5) for passing through the rotating lug (5), wherein a bending face (6-1) of the cover plate (6) is disposed above the support rod (8), such that during unlocking, an included angle defined by the support rod (8) and the rotating lug (5) via a connecting point is an obtuse angle on a side facing towards the upper cover (3).

7. The optical module structure with self-sinking unlocking according to claim 6, wherein the right connecting piece of the support rod (8) is a hole pair (8-6) defined on two parallel arms (8-4), wherein the first connecting piece (5-1) is a first rotating shaft (5-1) and two ends of the first rotating shaft (5-1) respectively pass through the hole pair (8-6), and wherein the stem (5-4) fixing the first connecting piece (5-1) is partially disposed between the two arms (8-4).

8. The optical module structure with self-sinking unlocking according to claim 7, wherein an end face of the first connecting piece (5-1) is a structure with a ramp, and when the rotating lug (5) is coupled to the support rod (8), the first connecting piece (5-1) is configured to pushed from an apex angle side of the ramp into the hole pair (8-6) in the two arms (8-4) of the support rod (8).

9. The housing structure of an optical module with self-sinking unlocking according to claim 6, wherein the base (1) is provided with a groove (1-5), and wherein the groove (1-5) is configured to receive a stem (8-2) of the support rod (8).

10. The optical module structure with self-sinking unlocking according to claim 6, wherein when the second connecting piece (5-3) is a second rotating shaft (5-3), the second connecting piece (5-3) is disposed on the base (1); wherein the second rotating shaft (5-3) is engaged with a semicircular groove (1-10) on the base (1) and a semicircular groove (3-4) on the upper cover (3); or an end face of the second rotating shaft (5-3) is a structure with a ramp, and when the second rotating shaft (5-3) is coupled to the semicircular groove (1-10), the second rotating shaft (5-3) is configured to pushed from an apex angle side into a hole pair in the semicircular groove (1-10) on the base (1).

11. The optical module structure with self-sinking unlocking according to claim 6, wherein in an unlocking state, relative to a bottom plate of the base (1), the rotating shaft (9-2) is disposed above the second connecting piece (5-3) of the rotating lug (5); and wherein the stem (5-4) of the rotating lug (5) is configured to be bent at a position where the lug (5-2) is fixed, such that during locking and unlocking, a tangent of a movement trajectory of the lug (5-2) on the groove structure (3-5) of the upper cover (3) is configured to be perpendicular to a surface of the upper cover (3).

* * * * *